United States Patent
Tamura et al.

(10) Patent No.: US 7,098,699 B2
(45) Date of Patent: Aug. 29, 2006

(54) BUFFER CIRCUIT DEVICE SUPPLYING A COMMON MODE VOLTAGE APPLICABLE TO A NEXT-STAGE CIRCUIT RECEIVING OUTPUT SIGNALS OF THE BUFFER CIRCUIT DEVICE

(75) Inventors: Hirotaka Tamura, Kawasaki (JP); Satoshi Matsubara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/716,533

(22) Filed: Nov. 20, 2003

(65) Prior Publication Data
US 2004/0100838 A1 May 27, 2004

(30) Foreign Application Priority Data
Nov. 20, 2002 (JP) .............................. 2002-336794

(51) Int. Cl.
*H03B 1/00* (2006.01)
(52) U.S. Cl. ........................................ 327/108; 330/258
(58) Field of Classification Search ................. 327/108, 327/110, 112; 326/127; 330/258, 254, 260, 330/261
See application file for complete search history.

(56) References Cited

U.S. PATENT DOCUMENTS

| | | | | |
|---|---|---|---|---|
| 5,146,152 A | * | 9/1992 | Jin et al. ..................... | 323/280 |
| 5,613,233 A | * | 3/1997 | Vagher ........................ | 455/296 |
| 5,838,200 A | * | 11/1998 | Opris .......................... | 330/258 |
| 6,081,162 A | * | 6/2000 | Johnson ....................... | 330/301 |
| 6,107,882 A | * | 8/2000 | Gabara et al. ............... | 330/253 |
| 6,166,971 A | | 12/2000 | Tamura et al. .............. | 365/198 |
| 6,335,655 B1 | * | 1/2002 | Yamamoto ................... | 327/552 |
| 6,417,728 B1 | * | 7/2002 | Baschirotto et al. ........... | 330/9 |
| 6,784,744 B1 | * | 8/2004 | Tichauer ..................... | 330/285 |
| 2003/0122593 A1 | * | 7/2003 | Volk ............................ | 327/108 |

FOREIGN PATENT DOCUMENTS

JP     2000-196680     7/2000

* cited by examiner

*Primary Examiner*—Tuan T. Lam
(74) *Attorney, Agent, or Firm*—Arent Fox PLLC

(57) ABSTRACT

A buffer circuit device, which receives differential input signals and outputs differential output signals, has a buffer circuit, a common mode level generator circuit, a common mode voltage detection circuit, and a bias voltage adjusting circuit. The buffer circuit receives the input signals and outputs the output signals, and the common mode level generator circuit outputs a specific level of a common mode voltage of the output signals to be output from the buffer circuit. The common mode voltage detection circuit detects a common mode voltage of specific signals, and the bias voltage adjusting circuit adjusts a bias voltage to be supplied to the buffer circuit by comparing an output signal of the common mode level generator circuit with an output signal of the common mode voltage detection circuit.

17 Claims, 8 Drawing Sheets

BUFFER CIRCUIT DEVICE SUPPLYING A COMMON MODE VOLTAGE APPLICABLE TO A NEXT-STAGE CIRCUIT RECEIVING OUTPUT SIGNALS OF THE BUFFER CIRCUIT DEVICE

CROSS REFERENCE TO RELATED APPLICATION

This application is based upon and claims the benefit of priority from the prior Japanese Patent Application No. 2002-336794, filed on Nov. 20, 2002, the entire contents of which are incorporated herein by reference.

BACKGROUND OF THE INVENTION

1. Field of the Invention

The present invention relates to a signal transmission technique for transmitting signals at high speed between LSI chips or between elements or circuit blocks in an LSI chip, and between circuit boards or cabinets. More particularly, the present invention relates to a buffer circuit device for distributing a high-speed clock signal or outputting a high-speed data signal.

2. Description of the Related Art

Recently, the performance of components used in computers and other information processing apparatuses has been greatly improved. In particular, dramatic improvements have been made, for example, in the performance of semiconductor memory devices such as SRAMs (Static Random Access Memories) and DRAMs (Dynamic Random Access Memories), and other semiconductor devices such as processors and switching LSIs. The improvements in the performance of semiconductor memory devices, processors, and the like have reached the point where system performance cannot be improved further unless the speed of signal transmission between components or elements is increased.

Specifically, the speed gap between a DRAM and a processor (i.e., between LSIS), for example, has been widening year by year and, in recent years, this speed gap has been becoming a bottleneck impeding performance improvement for a computer as a whole. Furthermore, with increasing integration and increasing size of semiconductor chips, the speed of signal transmission between elements or circuit blocks within a chip is becoming a major factor limiting the performance of the chip. Moreover, the speed of signal transmission between a peripheral device and the processor/chipset is also becoming a factor limiting the overall performance of the system.

By the way, various kinds of clock, data, and the like signals are output through a buffer (buffer circuit device) so as to be transmitted between circuit blocks or LSI chips or cabinets. Especially, differential signals have been transmitted through a differential buffer along with high-speed and low voltage (small signal amplitude) in recent years. However, the common mode voltage of the differential signals output from the buffer and the common mode voltage necessary for a circuit (next-stage circuit) receiving the output signals of the buffer are frequently different. In such a case, an input sensitivity of the next-stage circuit may be reduced so that high-speed signal transmission may not be realized.

The prior art and its associated problems will be described in detail later with reference to relevant drawings.

SUMMARY OF THE INVENTION

An object of the present invention is to provide a buffer circuit device supplying a common mode voltage applicable to a next-stage circuit receiving output signals of the buffer circuit device, and to realize a high-speed signal transmission without causing the reduction of an input sensitivity of the next-stage circuit.

According to the present invention, there is provided a buffer circuit device receiving differential input signals and outputting differential output signals, comprising a buffer circuit receiving the input signals and outputting the output signals; a common mode level generator circuit outputting a specific level of a common mode voltage for the output signals to be output from the buffer circuit; a common mode voltage detection circuit detecting a common mode voltage of specific signals; and a bias voltage adjusting circuit adjusting a bias voltage to be supplied to the buffer circuit by comparing an output signal of the common mode level generator circuit with an output signal of the common mode voltage detection circuit.

The common mode level generator circuit may output a signal having a preferable voltage level as a common mode voltage of input signals of a next-stage circuit to which the output signals of the buffer circuit are supplied. The common mode voltage detection circuit may detect a common mode voltage of the output signals of the buffer circuit. The common mode voltage detection circuit may detect a common mode voltage of output signals of the next-stage circuit.

The common mode voltage detection circuit may output the output signal to the bias voltage adjusting circuit by processing the detected common mode voltage and an output voltage of the common mode level generator circuit. The common mode voltage detection circuit may comprise first and second resistor elements coupling the differential input signals; and a third resistor element connected in series to an output of the common mode level generator circuit.

The common mode voltage detection circuit may further comprise a first capacitor element connected between a common connection node of the first and second resistor elements and a specific power supply line; and a second capacitor element connected between an output node of the third resistor element and the specific power supply line. The bias voltage adjusting circuit may be a comparator having a first input connected to the common connection node of the first and second resistor elements and a second input connected to the output node of the third resistor element.

The common mode level generator circuit may comprise a replica circuit depending on the next-stage circuit. The replica circuit may have features corresponding to all the features of the next-stage circuit. The replica circuit may have features corresponding to some features of the next-stage circuit.

The common mode level generator circuit may comprise a constant current source. The common mode level generator circuit may comprise a plurality of resistor elements connected between a high potential power supply line and a low potential power supply line, and may generate a specific level divided by the plurality of resistor elements.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Before proceeding to the detailed description of a buffer circuit device according to the present invention, a prior art buffer circuit device and its associated problems will be described with reference to FIG. 1.

Figure 1:
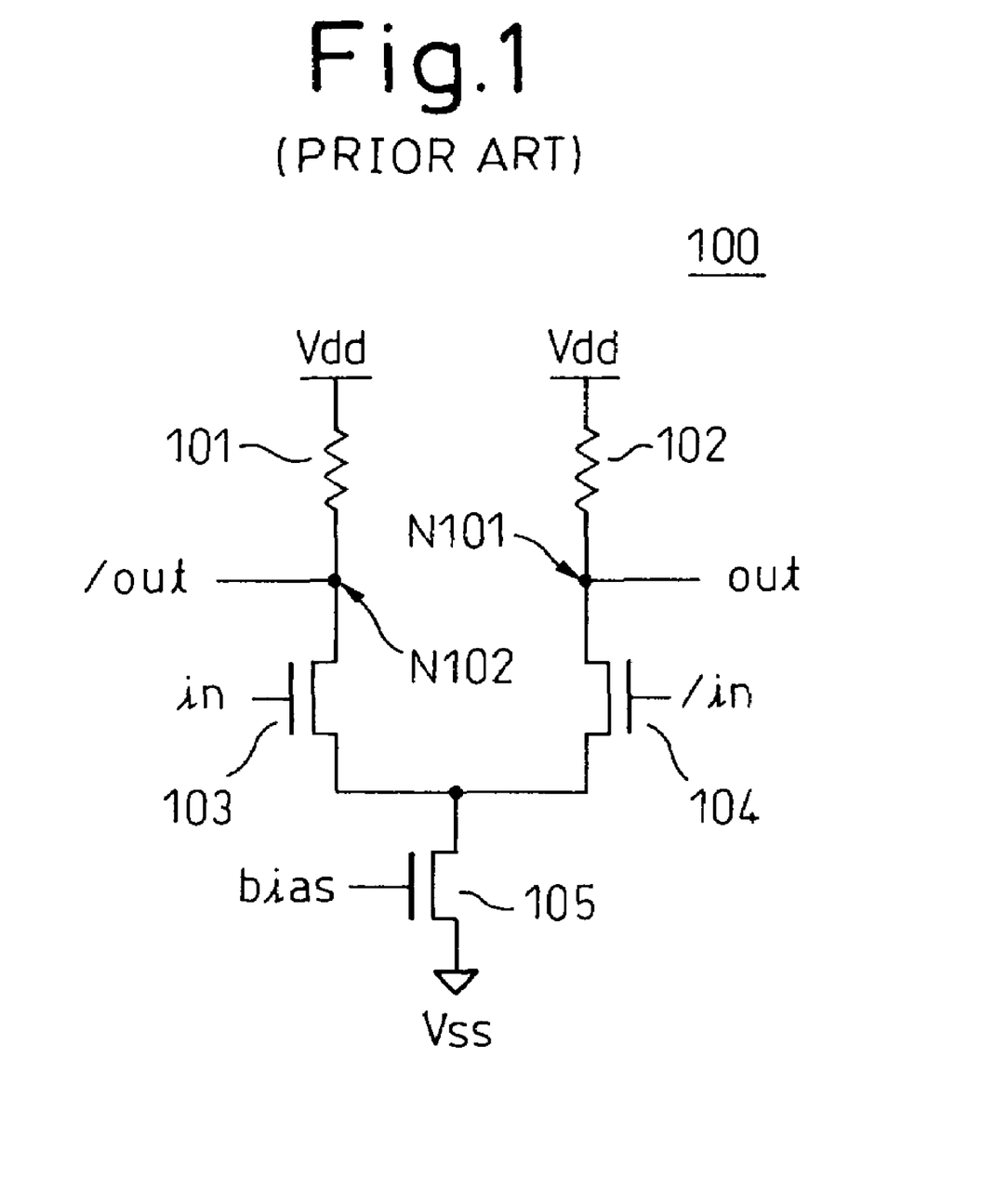
FIG. 1 is a circuit diagram showing one example of a buffer circuit device according to the prior art.

FIG. 1 shows one example of a buffer circuit device according to the prior art and, more particularly, shows a buffer circuit based on differential CML (Current Mode Logic).

As shown in FIG. 1, the prior art buffer circuit device comprises loads 101, 102 connected to a high potential power supply line Vdd; n-channel type MOS transistors (nMOS transistors) 103, 104 whose gates receive differential (complementary) input signals in, /in and whose drains are connected to the loads 101, 102; and an nMOS transistor 105 connected between sources of the nMOS transistors 103, 104 and a low potential power supply line Vss, whose gate receives a bias voltage bias. Here, differential output signals out and /out are output from a connection node N101 of the load 102 and the drain of the nMOS transistor 104 and a connection node N102 of the load 101 and the drain of the nMOS transistor 103, respectively.

By the way, in recent years, the power supply voltage (Vdd) applied to the above described buffer circuit device is, for example, 1.2 V or lower, and a common mode voltage (center voltage between a voltage of a high level "H" and a voltage of a low level "L" of output signals) is, generally determined to be a voltage higher than vdd/2 (for example, 0.8 V when the power supply voltage (Vdd) is 1.2 V).

In the prior art, there is proposed a receiver circuit used for a signal transmission system to realize a high accuracy signal transmission (high accuracy signal detection) by effectively controlling a common mode voltage. The receiver circuit has a capacitor network portion receiving differential input signals and a comparator portion, and maintains the common mode voltage at about a constant value. This prior art receiver circuit is, for example, disclosed in Japanese Unexamined Patent Publication No. 2000-196680 (corresponding to U.S. Pat. Nos. 6,166,971 and 6,400,616, and EP-0963083-A2).

In recent years, for example, a high speed signal transmission carried out in an LSI is generally designed by using a buffer circuit based on differential CML, and a common mode voltage of output signals is generally higher than a voltage of Vdd/2. On the other hand, a next-stage circuit receiving the output signals of the buffer circuit requires an individual common mode voltage (in many cases, Vdd/2) of input signals in accordance with the circuit features thereof and, therefore, an input sensitivity of the next-stage circuit is reduced when the buffer circuit outputs output signals having a common mode voltage which is not applicable to the next-stage circuit. This problem of the buffer circuit not only appeares in a clock buffer circuit used for distributing a clock signal, but it also appeares in other general buffer circuits (general buffer circuit devices) used for buffering various signals.

Next, the basic configuration of a buffer circuit device according to the present invention will be described.

Figure 2:
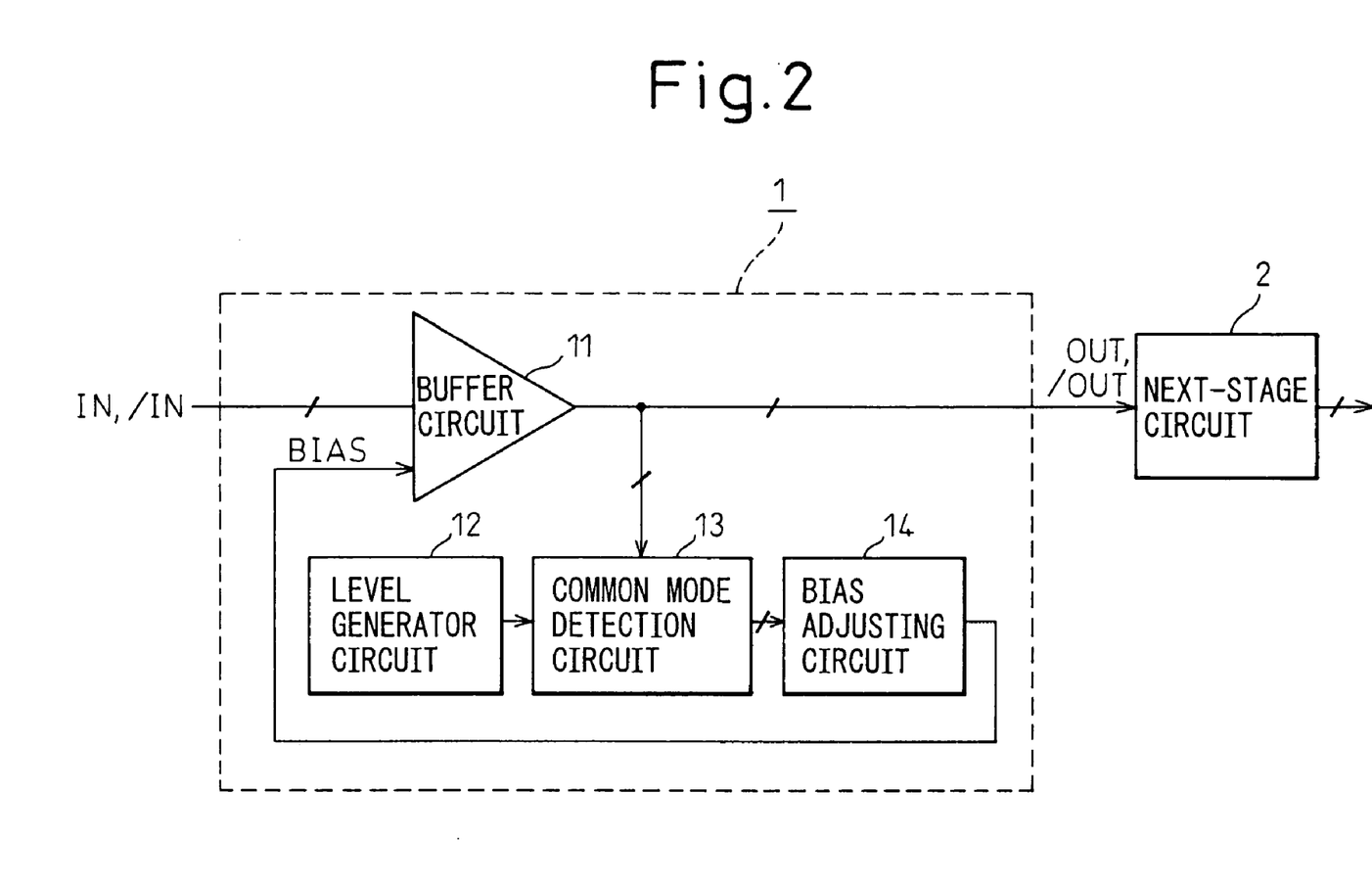
FIG. 2 is a circuit diagram showing the basic configuration of a buffer circuit device according to the present invention.

FIG. 2 shows the basic configuration of a buffer circuit device according to the present invention.

As shown in FIG. 2, a buffer circuit 11 receives input signals IN, /IN and outputs output signals OUT, /OUT, and a level generator circuit (common mode level generator circuit) 12 generates a specific level common mode voltage of the output signals OUT, /OUT output from the buffer circuit 11. Further, a common mode detection circuit (common mode voltage detection circuit) 13 detects a common mode voltage of specific signals such as the output signals of the buffer circuit 12 or output signals of a next-stage circuit 2, and a bias adjusting circuit 14 adjusts a bias voltage BIAS which is supplied to the buffer circuit 11 by comparing the output of the common mode level generator circuit 12 and the output of the common mode voltage detection circuit 13.

In this way, a common mode voltage of the output signals OUT, /OUT output from the buffer circuit device 1 to the next-stage circuit 2 is applicable to the next-stage circuit 2 and, thereby, the next-stage circuit (receiver circuit) 2 receives the output signals OUT, /OUT of the buffer circuit device having the common mode voltage applicable to the next-stage circuit 2 without causing a deterioration of the input sensitivity thereof.

Below, embodiments of the buffer circuit device according to the present invention will be described in detail with reference to the accompanying drawings.

Figure 3:
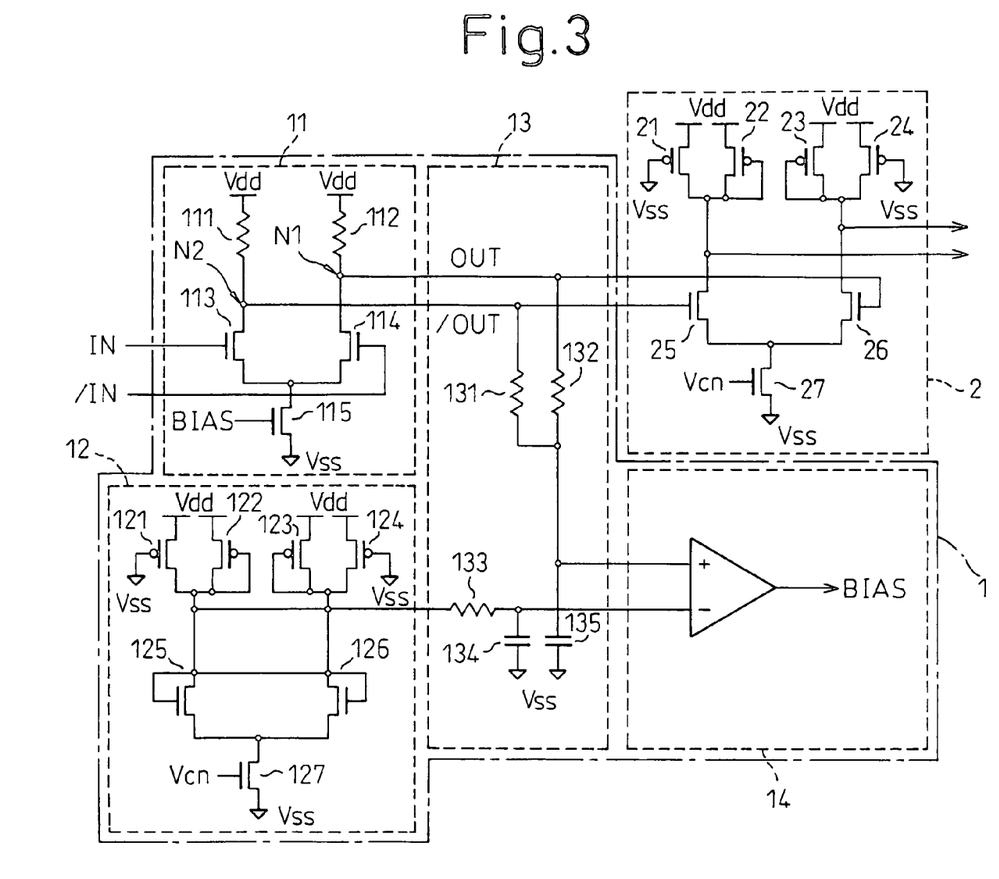
FIG. 3 is a circuit diagram showing a first embodiment of the buffer circuit device according to the present invention.

FIG. 3 shows a first embodiment of the buffer circuit device according to the present invention. In FIG. 3, reference numeral 1 denotes a buffer circuit device, 11 denotes a buffer circuit, 12 denotes a common mode level generator circuit, 13 denotes a common mode voltage detection circuit, 14 denotes a bias adjusting circuit, and 2 denotes a next-stage circuit. Further, reference In, /IN denote differential input signals, OUT, /OUT denote differential output signals, Vdd denotes a high potential power supply line (high potential power supply voltage), and Vss denotes a low potential power supply line (low potential power supply voltage).

As shown in FIG. 3, in the first embodiment of the buffer circuit device according to the present invention, the buffer circuit 11 is constituted by a buffer (buffer circuit) based on differential CML, which is similar to that described above with reference to FIG. 1. Specifically, the buffer circuit 11 comprises loads 111, 112 connected to the high potential power supply line Vdd; nMOS transistors 113, 114 whose gates receive differential (complementary) input signals IN, /IN and whose drains are connected to the loads 111, 112; and an nMOS transistor 115 connected between sources of the nMOS transistors 113, 114 and the low potential power supply line Vss, whose gate receives a bias voltage BIAS (output of the bias adjusting circuit 14). Here, differential output signals OUT and /OUT are output from a connection node N1 of the load 112 and a drain of the nMOS transistor 114 and a connection node N2 of the load 111 and a drain of the nMOS transistor 113, respectively.

In the first embodiment of the buffer circuit device according to the present invention, the common mode level generator circuit 12 comprises a replica circuit having a construction corresponding to the next-stage circuit 2. Specifically, the next-stage circuit 2 comprises pMOS transistors 21, 22 and 23, 24 used for loads, nMOS transistors 25, 26 used for differential input transistors, and an nMOS transistor 27 whose gate receives a constant voltage (bias voltage) Vcn. Similarly, the common mode level generator circuit (replica circuit) 12 comprises pMOS transistors 121, 122 and 123, 124, nMOS transistors 125, 126, and an nMOS transistor 127 whose gate receives the constant voltage (bias voltage) Vcn. Here, in the common mode level generator circuit (replica circuit) 12, input terminals (differential input terminals) and output terminals (differential output nodes) are short-circuited, as the common mode level generator circuit 12 is only used to generate the common mode voltage.

The common mode voltage detection circuit 13 couples the differential output signals OUT, /OUT of the buffer circuit 11 by using resistor elements 132, 131, an output signal of the common mode voltage detection circuit 13 (signal at a common node of the resistor elements 131 and 132) is supplied to a positive logic input terminal of the bias adjusting circuit (comparator) 14, and an output signal of the common mode level generator circuit 12 is applied to a negative logic input terminal of the bias adjusting circuit 14 through a resistor element 133. Here, capacitor elements 135 and 134 are provided between the positive and negative input terminals of the bias adjusting circuit 14 and the low potential power supply line Vss. Further, the differential output signals OUT, /OUT of the buffer circuit 11 are supplied to the next-stage circuit 2 as differential input signals thereof.

As described above, an output signal (bias voltage BIAS) of the bias adjusting circuit (comparator) 14 is fed back to the gate of nMOS transistor 115 of the buffer circuit 11 and, thereby, the common mode voltage of the output signals (OUT, /OUT) of the buffer circuit 11 is adjusted to fit with a level of the common mode voltage of the next-stage circuit 2.

In this way, according to the first embodiment of the buffer circuit device of the present invention, a replica circuit of the next-stage circuit 2 is used as the common mode level generator circuit 12, and therefore, the output signals OUT, /OUT having a common mode voltage to maximize a gain of the next-stage circuit 2 can be output.

Figure 4:
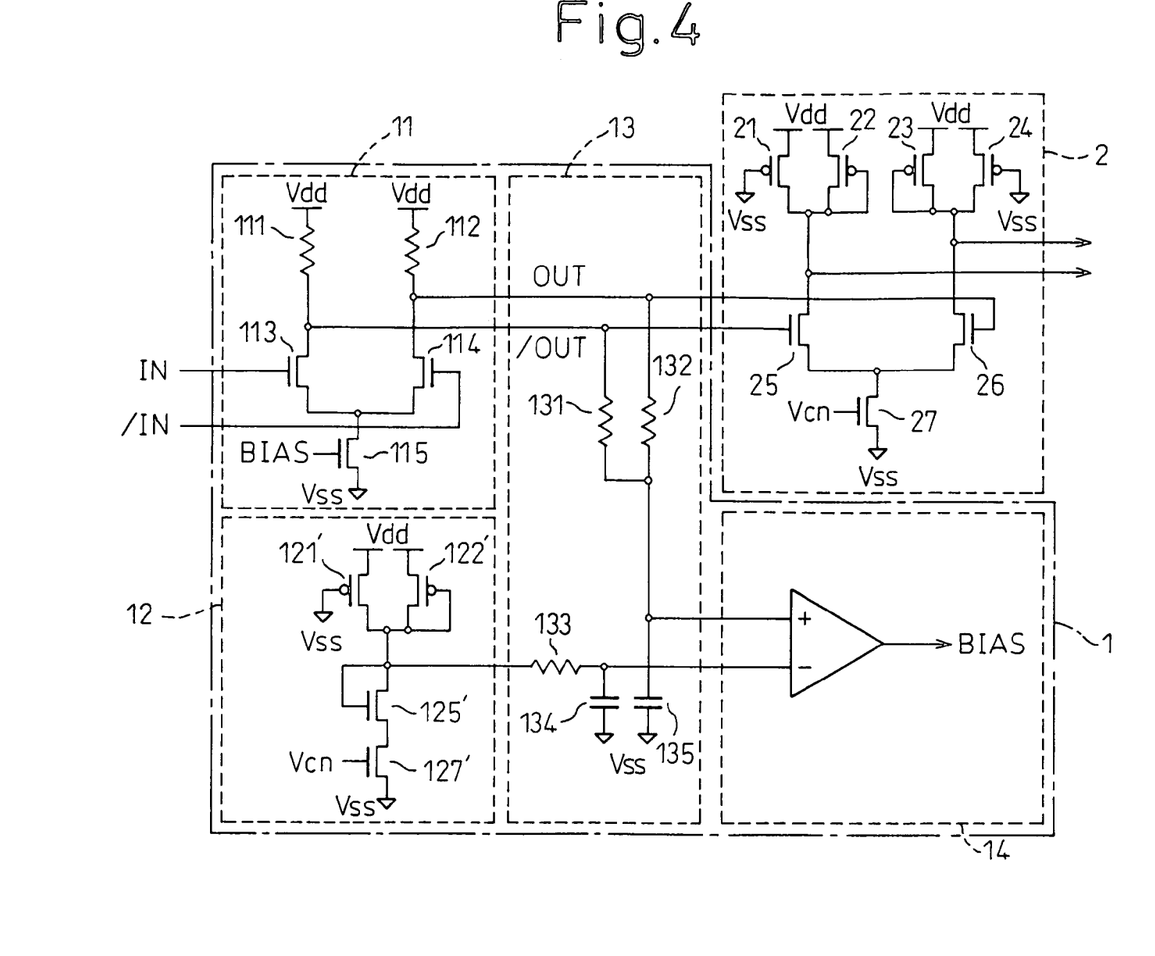
FIG. 4 is a circuit diagram showing a second embodiment of the buffer circuit device according to the present invention.

FIG. 4 shows a second embodiment of the buffer circuit device according to the present invention.

As it is clear by comparing FIG. 4 with the above explained FIG. 3, in the buffer circuit device 1 of the second embodiment of the present invention, the common mode level generator circuit 12 does not correspond all the features of the next-stage circuit 2, and corresponds to only a some features (features for one of the differential signals) of the next-stage circuit 2. Specifically, in the second embodiment of the buffer circuit device according to the present invention, the common mode level generator circuit (replica circuit) 12 is constituted by pMOS transistors 121', 122' and nMOS transistors 125', 127'. Here, the nMOS transistor 127' of the common mode level generator circuit 12 has a half size of the nMOS transistor 127 of the common mode level generator circuit 12 of the first embodiment shown in FIG. 3, that is, a gate width of the transistor 127' is a half size of that of the transistor 127.

Figure 5:
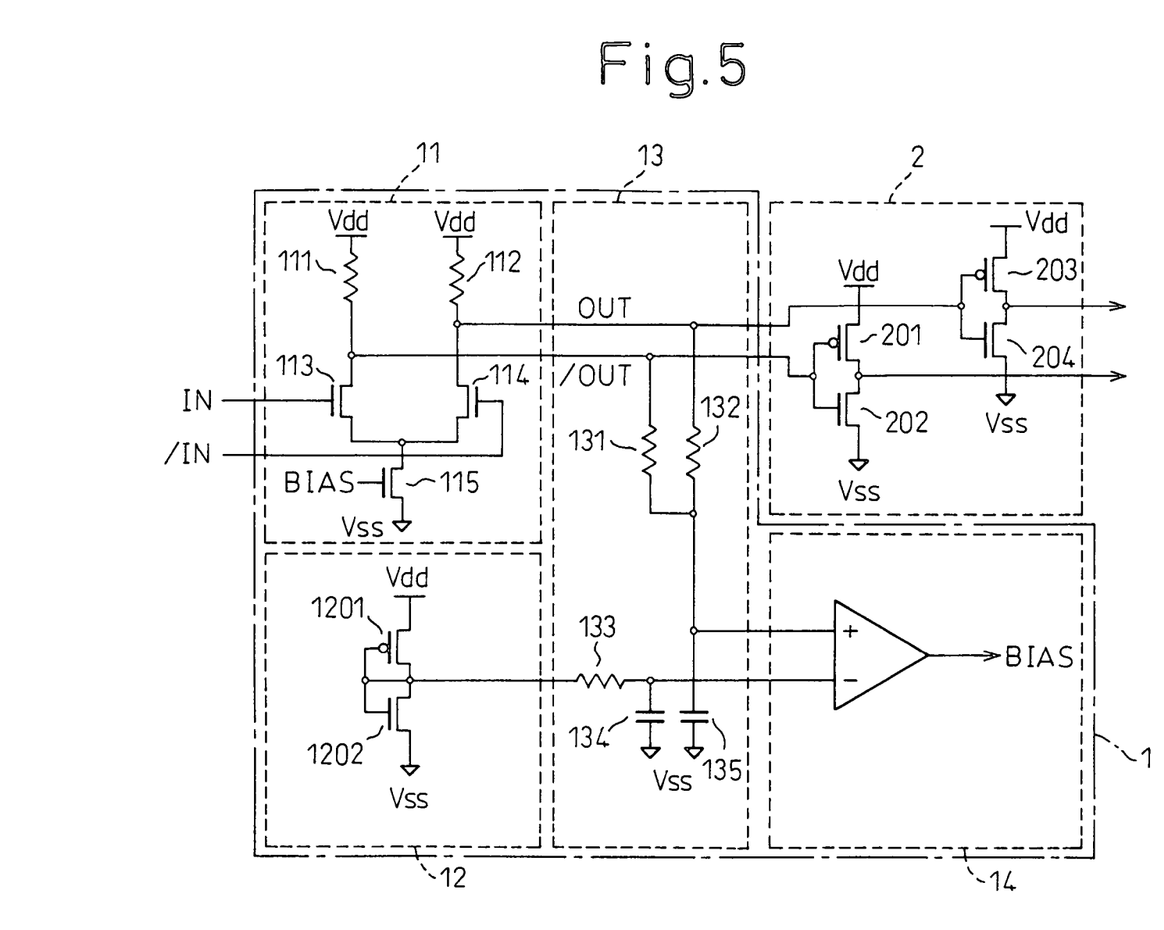
FIG. 5 is a circuit diagram showing a third embodiment of the buffer circuit device according to the present invention.

FIG. 5 shows a third embodiment of the buffer circuit device according to the present invention.

As shown in FIG. 5, in the buffer circuit device 1 of the third embodiment according to the present invention, the next-stage circuit 2 comprises two inverters (transistors 201, 202; 203, 204) to amplify the differential output signals OUT, /OUT of the buffer circuit 11 (buffer circuit device 1), and further, the common mode level generator circuit (replica circuit) 12 is also constituted by an inverter having a PMOS transistor 1201 and an nMOS transistor 1202.

As described above, the features of the common mode level generator circuit 12 can be modified in accordance with that of the next-stage circuit 2 and, thereby, a common mode voltage of the output signals of the buffer circuit device 1 can be generated to suit the next-stage circuit 2.

Figure 6:
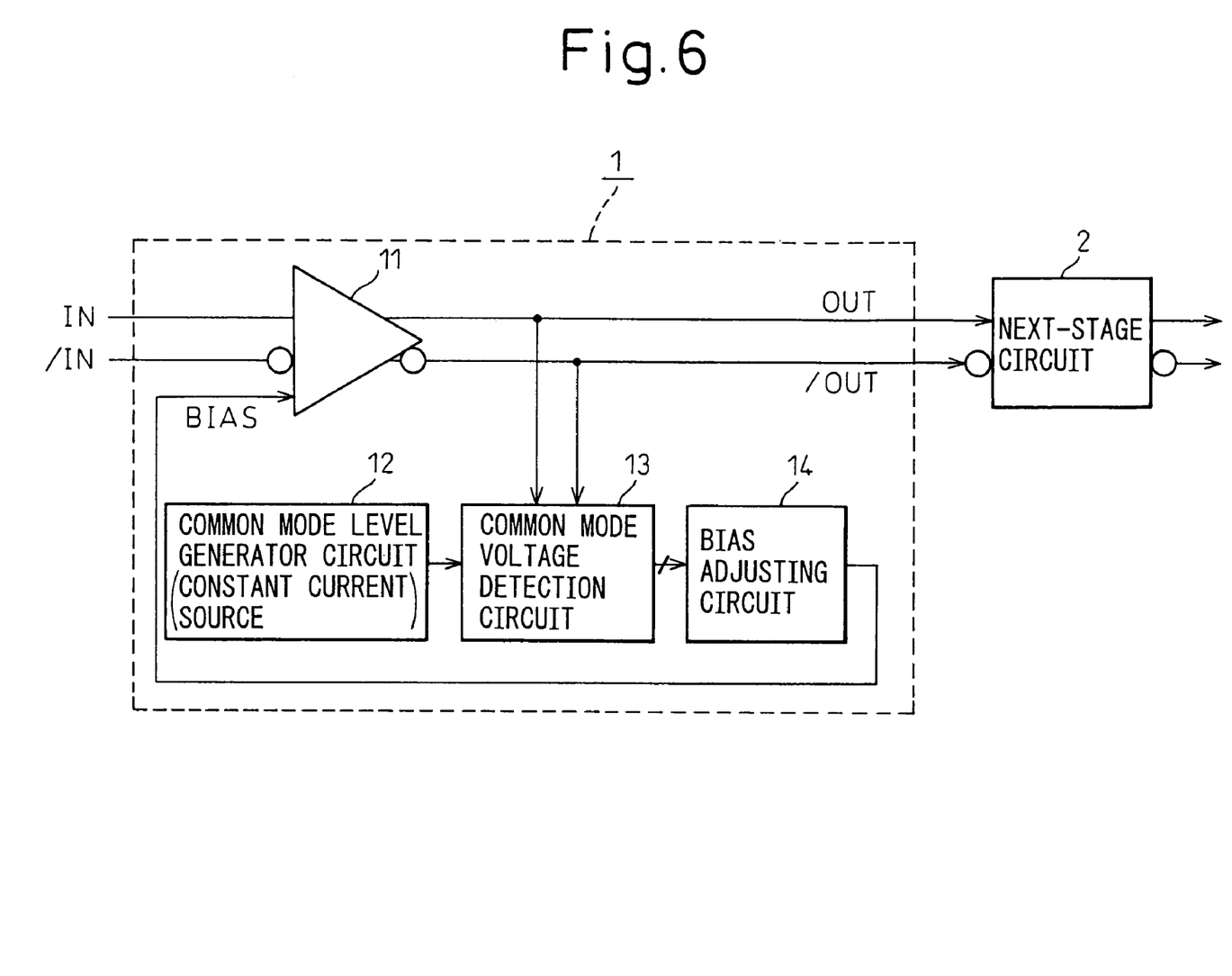
FIG. 6 is a block diagram schematically showing a fourth embodiment of the buffer circuit device according to the present invention.

FIG. 6 schematically shows a fourth embodiment of the buffer circuit device according to the present invention.

As shown in FIG. 6, in the fourth embodiment of the buffer circuit device according to the present invention, the common mode level generator circuit 12 is constituted by a constant current source. Here, the other features of the buffer circuit device of the fourth embodiment, that is, the features of the buffer circuit 11, the common mode voltage detection circuit 13 and the bias adjusting circuit 14 are, for example, the same as that described in the first embodiment with reference to FIG. 3.

In the buffer circuit device of the fourth embodiment according to the present invention, a constant current source is used as the common mode level generator circuit 12 and, therefore, output signals OUT, /OUT having a common mode voltage not receiving the influence of fluctuations of the power supply voltage or circumstance temperature, can be output. The buffer circuit device of the fourth embodiment is suitable for the case when a signal level range of the input signals of the next-stage circuit 2 (differential output signals OUT, /OUT of the buffer circuit device) is previously determined, wherein the differential output signals OUT, /OUT can be controlled within the specific signal level range. Here, various types of known constant current sources can be applied as the constant current source of the common mode level generator circuit 12.

Figure 7:
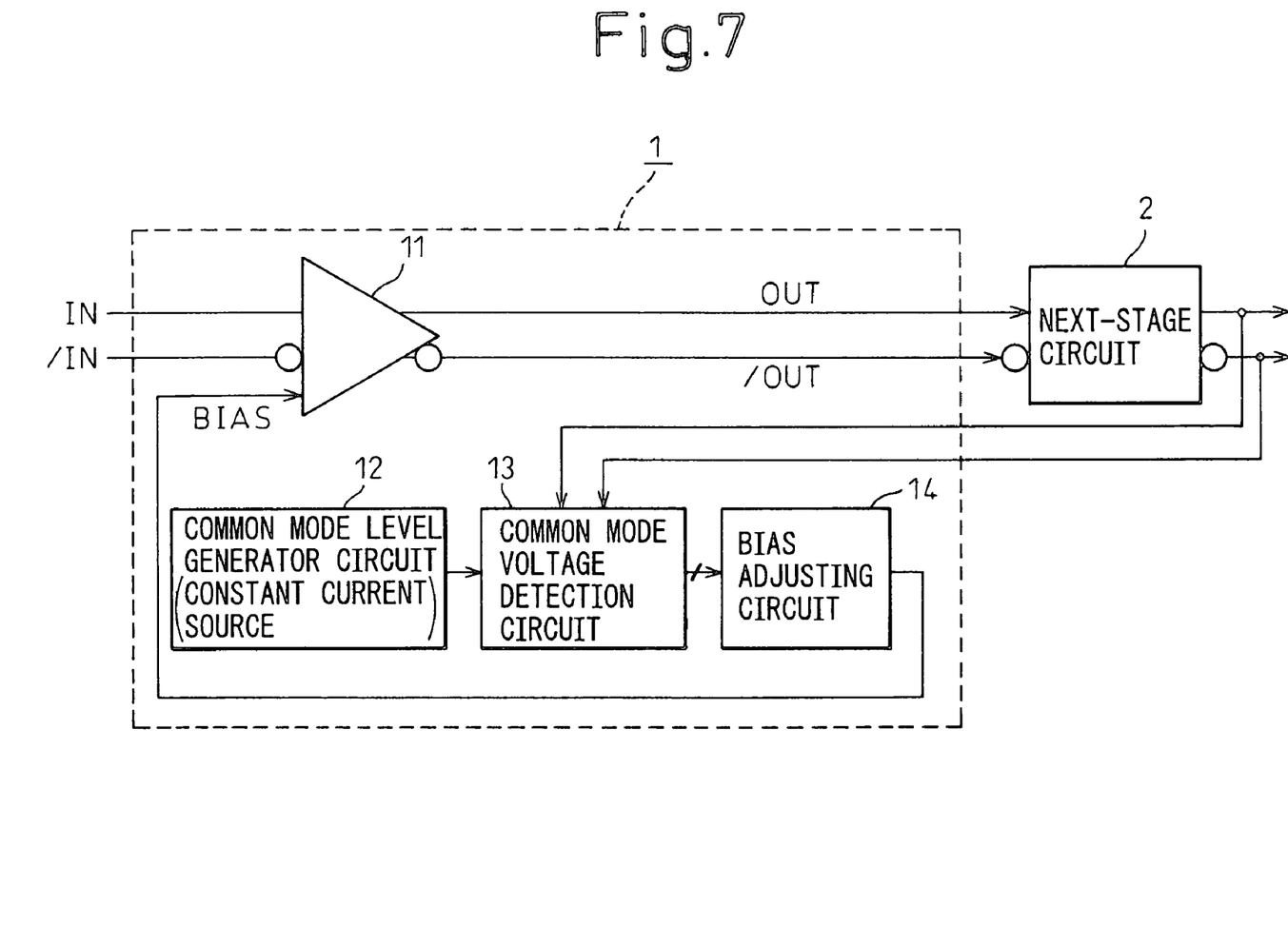
FIG. 7 is a block diagram schematically showing a fifth embodiment of the buffer circuit device according to the present invention.

FIG. 7 schematically shows a fifth embodiment of the buffer circuit device according to the present invention.

As it is clear by comparing FIG. 7 with the above explained FIG. 6, in the buffer circuit device 1 of the fifth embodiment according to the present invention, the common mode detection circuit 13 receives output signals (differential output signals) of the next-stage circuit 2 and the level of the bias signal BIAS output from the bias adjusting circuit 14 is controlled in accordance with the output signals of the next-stage circuit 2.

According to the buffer circuit device of the fifth embodiment of the present invention, for example, the differential output signals of the next-stage circuit 2 can be controlled within a predetermined level range.

Figure 8:
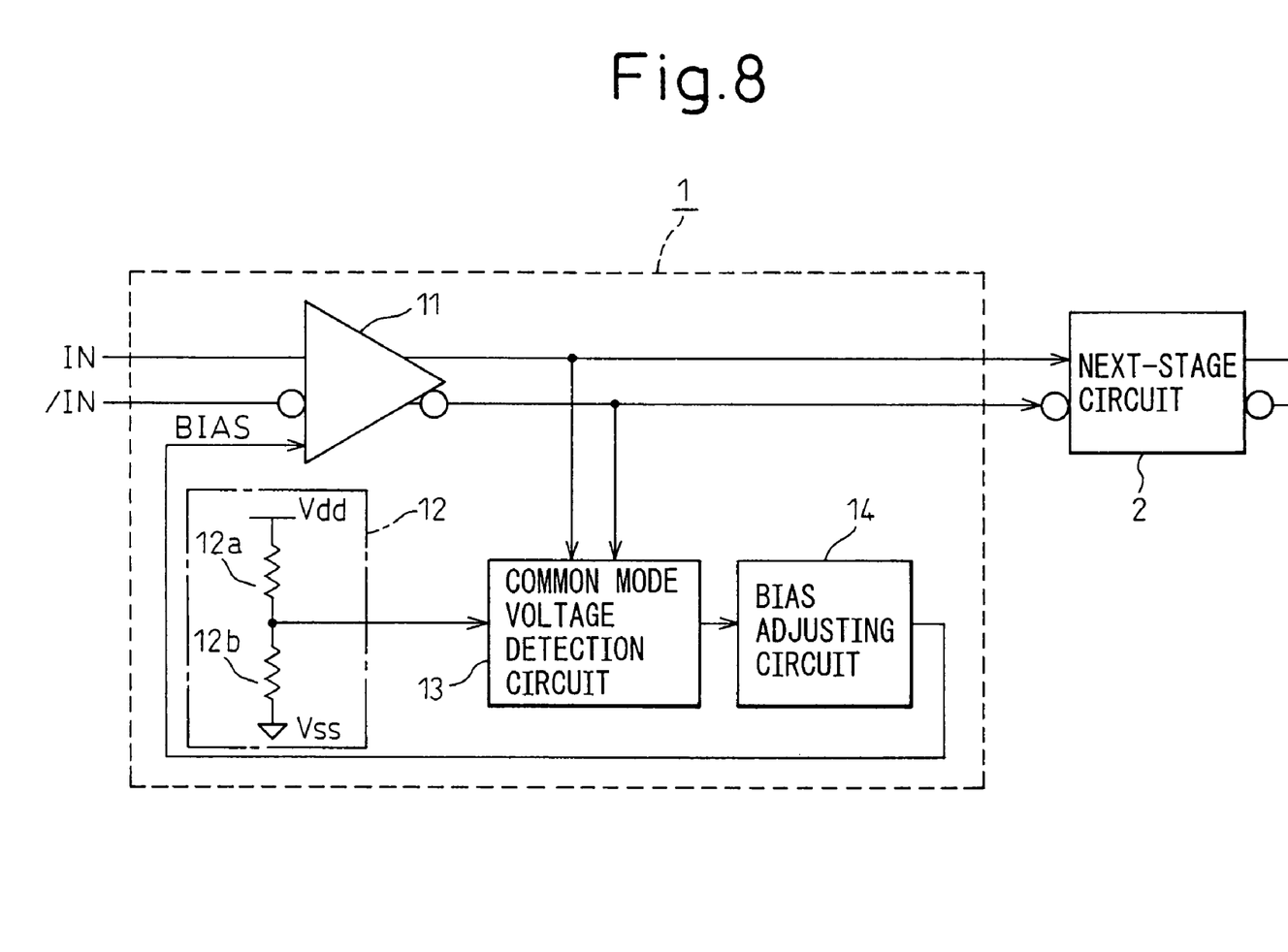
FIG. 8 is a block diagram schematically showing a sixth embodiment of the buffer circuit device according to the present invention.

FIG. 8 schematically shows a sixth embodiment of the buffer circuit device according to the present invention.

As shown in FIG. 8, in the buffer circuit device of the sixth embodiment according to the present invention, the common mode level generator circuit 12 is constituted by resistor elements 12a, 12b connected between the high potential power supply line Vdd and the low potential power supply line Vss, and a voltage divided by the resistor elements 12a, 12b is supplied to the common mode voltage detection circuit 13 as an output of the common mode level generator circuit 12.

According to the buffer circuit device of the sixth embodiment of the present invention, an output of the common mode level generator circuit 12 is generated by dividing the power supply voltage using resistor elements and, therefore, a feedback control can be carried out without receiving the influence of fluctuations of the power supply voltage or temperature. Here, the resistor elements 12a, 12b are, for example, made of poly-silicon.

As described above, according to a buffer circuit device of the present invention, a common mode voltage applicable to a next-stage circuit receiving output signals of the buffer circuit device can be generated and, therefore, a high-speed signal transmission can be realized without causing the reduction of an input sensitivity of the next-stage circuit.

Many different embodiments of the present invention may be constructed without departing from the spirit and scope of the present invention, and it should be understood that the present invention is not limited to the specific embodiments described in this specification, except as defined in the appended claims.

What is claimed is:

1. A buffer circuit device receiving differential input signals and outputting differential output signals, comprising:
   a buffer circuit receiving the differential input signals and outputting the differential output signals;
   a common mode level generator circuit having a replica circuit depending on a next-stage circuit and outputting a specific level of a common mode voltage for the differential output signals to be output from said buffer circuit:
   a common mode voltage detection circuit detecting a common mode voltage of specific signals; and
   a bias voltage adjusting circuit adjusting a bias voltage to be supplied to said buffer circuit by comparing an output signal of said common mode level generator circuit with an output signal of said common mode voltage detection circuit,
   wherein said common mode voltage detection circuit detects a common mode voltage of output signals of said next-stage circuit, and
   wherein said common mode voltage detection circuit outputs the output signal to said bias voltage adjusting circuit by processing the detected common mode voltage and an output voltage of said common mode level generator circuit,
   wherein said common mode voltage detection circuit comprises:
   a first and a second resistor elements coupling the differential output signals; and
   a third resistor element connected in series to an output of said common mode level generator circuit.

2. The buffer circuit device as claimed in claim 1, wherein said common mode voltage detection circuit further comprises:
   a first capacitor element connected between a common connection node of said first and second resistor elements and a specific power supply line; and
   a second capacitor element connected between an output node of said third resistor element and said specific power supply line.

3. The buffer circuit device as claimed in claim 2, wherein said bias voltage adjusting circuit is a comparator having a first input connected to the common connection node of said first and second resistor elements and a second input connected to the output node of said third resistor element.

4. The buffer circuit device as claimed in claim 1, wherein said replica circuit has features corresponding to all the features of said next-stage circuit.

5. The buffer circuit device as claimed in claim 1, wherein said replica circuit has features corresponding to some of the features of said next-stage circuit.

6. The buffer circuit device as claimed in claim 1, wherein said common mode level generator circuit comprises a constant current source.

7. The buffer circuit device as claimed in claim 1, wherein said common mode level generator circuit comprises a plurality of resistor elements connected between a high potential power supply line and a low potential power supply line, and generates a specific level divided by said plurality of resistor elements.

8. A buffer circuit device receiving differential input signals and outputting differential output signals, comprising:
   a buffer circuit receiving the differential input signals and outputting differential output signals;
   a common mode level generator circuit having a replica circuit depending on a next-stage circuit and outputting a specific level of a common mode voltage for the the differential output signals to be output from said buffer circuit;
   a common mode voltage detection circuit detecting a common mode voltage of specific signals; and
   a bias voltage adjusting circuit adjusting a bias voltage to be supplied to said buffer circuit by comparing an output signal of said common mode level generator circuit with an output signal of said common mode voltage detection circuit,
   wherein said common mode voltage detection circuit detects a common mode voltage of the output signals of said buffer circuit,
   wherein said common mode voltage detection circuit outputs the output signal to said bias voltage adjusting circuit by processing the detected common mode voltage and an output voltage of said common mode level generator circuit,
   wherein said common mode voltage detection circuit comprises:
   a first and a second resistor elements coupling the differential output signals; and
   a third resistor element connected in series to an output of said common mode level generator circuit.

9. The buffer circuit device as claimed in claim 8, wherein said common mode voltage detection circuit further comprises:
   a first capacitor element connected between a common connection node of said first and second resistor elements and a specific power supply line; and
   a second capacitor element connected between an output node of said third resistor element and said specific power supply line.

10. The buffer circuit device as claimed in claim 9, wherein said bias voltage adjusting circuit is a comparator having a first input connected to the common connection node of said first and second resistor elements and a second input connected to the output node of said third resistor element.

11. The buffer circuit device as claimed in claim 8, wherein said replica circuit has features corresponding to all the features of said next-stage circuit.

12. The buffer circuit device as claimed in claim 8, wherein said replica circuit has features corresponding to some of the features of said next-stage circuit.

13. The buffer circuit device as claimed in claim 8, wherein said common mode level generator circuit comprises a constant current source.

14. The buffer circuit device as claimed in claim 8, wherein said common mode level generator circuit comprises a plurality of resistor elements connected between a high potential power supply line and a low potential power supply line, and generates a specific level divided by said plurality of resistor elements.

15. A buffer circuit device receiving differential input signals and outputting differential output signals, comprising:
   a buffer circuit receiving the differential input signals and outputting the differential output signals;
   a common mode level generator circuit outputting a signal having a specific level of a common mode voltage for the differential output signals to be output from said buffer circuit, and having a preferable voltage level as a common mode voltage of input signals of a next-stage circuit to which the differential output signals of said buffer circuit are supplied;
   a common mode voltage detection circuit detecting a common mode voltage of output signals of said next-stage circuit; and
   a bias voltage adjusting circuit adjusting a bias voltage to be supplied to said buffer circuit so as to control the common mode voltage of the differential output signals of said buffer circuit substantially the same as the common mode voltage of the input signals of the next-stage circuit by comparing an output signal of said common mode level generator circuit with an output signal of said common mode voltage detection circuit, wherein said common mode voltage detection circuit outputs the output signal to said bias voltage adjusting circuit by processing the detected common mode voltage and an output voltage of said common mode level generator circuit, and wherein said common mode voltage detection circuit, comprises:
   a first and a second resistor elements coupling the differential output signals; and
   a third resistor element connected in a series to an output of said common mode level generator circuit.

16. The buffer circuit as claimed in claim 15, wherein said common mode voltage detection circuit further comprises:
   a first capacitor element connected between a common connection node of said first and second resistor elements and a specific power supply line; and
   a second capacitor element connected between an output node of said third resistor element and said specific power supply line.

17. The buffer circuit device as claimed in claim 16, wherein said bias voltage adjusting circuit is a comparator having a first input connected to the common connection node of said first and second resistor elements and a second input connected to the output node of said third resistor element.

* * * * *